United States Patent [19]

Cathey

[11] Patent Number: 5,314,578

[45] Date of Patent: May 24, 1994

[54] PROCESS FOR ETCHING A MULTI-LAYER SUBSTRATE

[75] Inventor: David A. Cathey, Boise, Id.

[73] Assignee: Micron Technology, Inc., Boise, Id.

[21] Appl. No.: 904,463

[22] Filed: Jun. 25, 1992

[51] Int. Cl.⁵ .......................................... H01L 21/00
[52] U.S. Cl. ................................. 156/662; 156/643; 156/646; 156/657; 156/656; 156/653; 156/652
[58] Field of Search ............... 156/643, 646, 662, 655, 156/656, 657, 653, 652

[56] References Cited

U.S. PATENT DOCUMENTS

| | | | |
|---|---|---|---|
| 4,465,552 | 8/1984 | Bobbio et al. | 156/653 |
| 4,734,157 | 3/1988 | Carbaugh | 156/643 |
| 4,904,338 | 2/1990 | Kozicki | 156/646 |

*Primary Examiner*—Brian E. Hearn
*Assistant Examiner*—George Goudreau
*Attorney, Agent, or Firm*—Michael W. Starkweather

[57] ABSTRACT

A carbon-containing, chemical etchant protective patterned layer is formed on a multi-layer substrate including a silicon dioxide layer formed on an underlying silicon or metal silicide layer by providing a predetermined pattern defining a plurality of openings in the carbon-containing, chemical etchant protective patterned layer. Next, the plurality of exposed areas of the major surface of the silicon dioxide structural layer are selectively etched with a substantially carbon-free chemical etchant system. These materials form a polyhalocarbon material in the presence of a carbon-containing material. Thus, since the chemical etchant protective patterned layer is carbon-containing, a localized polyhalocarbon deposition can be affected, at high selectivity conditions, by adding the carbon-free chemical etchant system in the presence of the protective patterned layer. More specifically, the hydrogen-containing material reacts with the carbon-free, halogen-containing material and the carbon-containing, chemical etchant protective patterned layer to selectively form in situ, at the point of interaction thereof, a polyhalocarbon protective coating layer on the silicon dioxide structural layer.

13 Claims, 1 Drawing Sheet

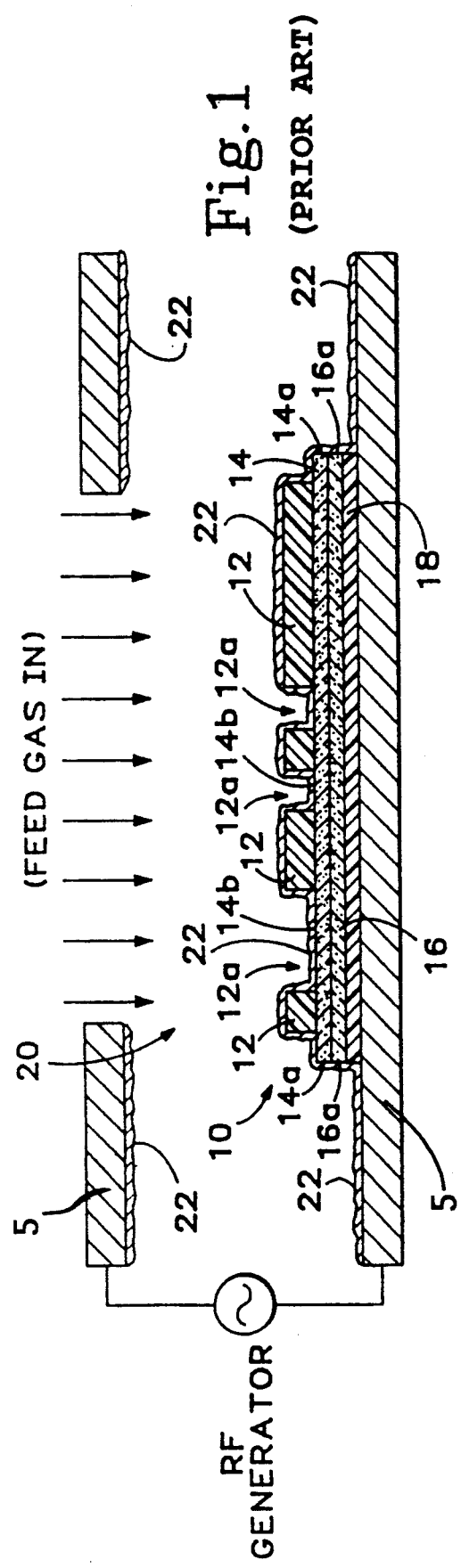
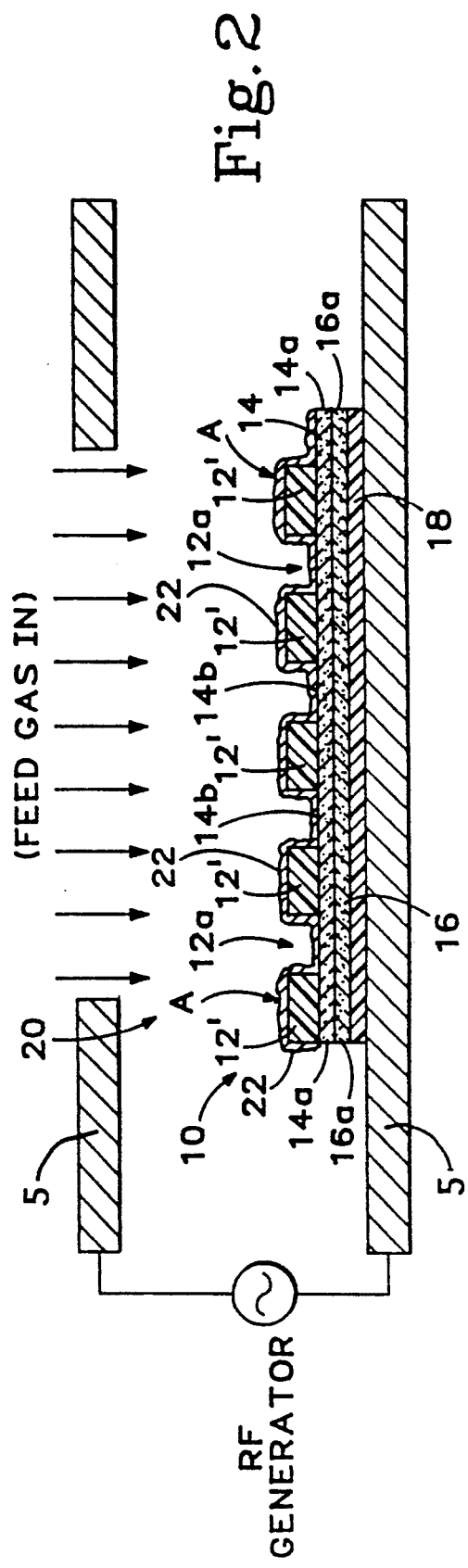

PROCESS FOR ETCHING A MULTI-LAYER SUBSTRATE

BACKGROUND OF THE INVENTION

This invention relates to a process for etching a multi-layer substrate, and more particularly to a process for effectively and efficiently etching multi-layer devices such as semiconductor devices.

It is known in the prior art that the manufacture of multi-layer semiconductor devices typically involves patterned etching using liquid or wet etching materials, or dry etching with halogens or halogen-containing compounds, of certain layers which comprise features these devices. For example, one well known etching material is chlorine which can exist in the etching process as either chlorine gas or HCl, etc. Chlorine etches the semiconductor isotropically, i.e., in both a lateral and vertical direction. This results in an etched feature which has a line width which is smaller than the resist image.

Etching can also be conducted in a gas phase using known techniques such as plasma etching, ion beam etching, and reactive ion etching. The gas plasma technology employs gaseous ions, typically generated by an RF discharge for etching and removing the requisite portion of the surface to be etched using a chemical reaction between the gaseous ions and the subject surface. In the anisotropic process, etching takes place only or primarily in the vertical direction so that feature widths substantially match the photoresist pattern widths. In U.S. Pat. No. 4,734,157 an elemental silicon-containing layer, such as a layer of polysilicon or silicide, is etched anisotropically employing a gas plasma comprising a gaseous chlorofluorocarbon, capable of supplying $CF_x$ and chlorine ions, and ammonia. Profile control of a silicon layer is controlled by the use of this etching mode.

The prior art etching chemical systems typically employ a mixture of etching chemicals. One portion of the mixture forms a fluorocarbon polymer, other portions provide additives for controlling bias or other application specifications, and another is an inert carrier material. The above-described prior art systems include $CHF_3/CF_4/He$, $CHF_3/SF_6/Ar$, $C_2F_4/CF_4/Ar$, and $C_2F_6/NH_3/Ar$.

In the etching process, a chemical etchant protective patterned layer is first formed on a major surface of the semiconductor device, typically on the outer surface of that device. Then, a chemical etchant protective patterned layer is provided and a predetermined pattern of openings are formed in the chemical etchant protective patterned layer based on a desired etch pattern. This exposes a plurality of areas of the major surface of the semiconductor device corresponding to a predetermined pattern of openings. Once the chemical etchant protective patterned layer is in place, the etching operation can commence.

An important aspect in forming a multi-layer semiconductor device, including a structural layer of $SiO_2$ formed on a silicon substrate, is controlling the selectivity of $SiO_2$ to Si or metal silicide ratios, particularly if a halogenated plasma gas is employed in a plasma etchant work area. The above-described fluorocarbon etchant gaseous mixtures are useful for that purpose. However, in each case where a multiple bond fluorocarbon, a hydrogen-containing fluorocarbon, a fluorocarbon and hydrogen, or a mixture of gases which include a carbon-containing gas, a hydrogen-containing gas and a halogen-containing gas are present in the plasma etch material, a fluorocarbon polymeric material is indiscriminately deposited on all of the surfaces of all of the production equipment located within the plasma etchant work area (see FIG. 1). The effect of this non-localized polyfluorocarbon deposition is the following:

1. a limiting condition for controlling the selectivity of $SiO_2$ to Si or metal silicide due to excessive polymer formation in the reactor when high $SiO_2$ to Si or metal silicide selectivities are obtained;

2. processes which are unstable due to excess polyfluorocarbon material builds-up; and 3. a requirement for more frequent cleaning of the equipment which results in a relatively high level of production downtime.

Therefore, a need exists for a process for etching semiconductor devices which selectively controls the $SiO_2$ to Si or metal silicide ratio, which is stable and avoids undue polymer build-up, and which requires only limited cleaning of the equipment.

SUMMARY OF THE INVENTION

The process of the present invention meets the above-described existing needs in etching semiconductors by forming a silicon dioxide structural layer on an underlying silicon or metal silicide structural substrate at relatively high $SiO_2$ to Si or metal silicide ratios employing a stable etching process, while at the same time controlling excess polymer build-up and limiting production downtime.

This is accomplished employing the process of the present invention for etching a multi-layer substrate to form a predetermined etched pattern therein. The process comprises providing a multi-layer substrate, typically a semiconductor device, having a plurality of layers. The layers of the multi-layer substrate include a silicon dioxide layer formed on a silicon or metal silicide substrate.

A chemical etchant protective layer is formed on a major surface of the silicon dioxide structural layer. This chemical etchant protective layer is formed of a carbon-containing type, for reasons which will be evident upon subsequent explanation, such as an etch mask formed of a Novolak-based resin or the like. A carbon-containing, chemical etchant protective patterned layer is then formed by providing a predetermined pattern defining a plurality of openings in the carbon-containing, chemical etchant protective patterned layer. The predetermined pattern defines the above-described plurality of openings. These openings expose a plurality of areas of the major surface of the multi-layer substrate corresponding to the predetermined pattern of the plurality of openings.

Next, the plurality of exposed areas of the major surface of the silicon dioxide structural layer are selectively etched with a substantially carbon-free chemical etchant system. Thus, instead of adding a polyhalocarbon material, or other gaseous mixtures containing carbon, hydrogen and halogen elements directly into the etching work area of the reactor by, for example, supplying all three elements in the feed gas as in the case of prior art etching processes, which results in the problems indicated above concerning $SiO_2$:Si or metal silicide selectivity, polymer build-up, and production downtime, the subject process introduces into the work area a carbon-free chemical etchant system comprising a halogen-containing chemical etching material and a hydrogen-containing material (see FIG. 1). These materials form a polyhalocarbon material in the presence of a carbon-containing material. Thus, since the chemical etchant protective patterned layer is carbon-containing, a localized polyhalocarbon deposition can be affected, at high selectivity conditions, by adding the carbon-free chemical etchant system in the presence of the protective patterned layer. More specifically, the hydrogen-containing material reacts with the carbon-free, halogen-containing material and the carbon-containing, chemical etchant protective patterned layer to selectively form in situ, at the point of interaction thereof, a polyhalocarbon protective coating layer on the silicon dioxide structural layer.

The polyhalocarbon material reacts with oxygen which is released from the silicon dioxide layer to form gaseous by-products which are readily removed from the multi-layer substrate. This exposes the surface of the silicon dioxide layer for continued selective etching of the silicon dioxide layer by the chemical etchant system down to the silicon or metal silicide layer, so that the silicon or metal silicide layer is exposed. Due to an absence of an oxygen source, i.e., the absence of the $SiO_2$ layer, to react with the polyhalocarbon material as it is being formed, the polyhalocarbon material remains in the selective formation area. However, the etching process with respect to the silicon or metal silicide layer is retarded by depositing the polyhalocarbon material on the oxygen-free silicon or metal silicide layer. Thus, a silicon dioxide structural layer on the underlying silicon or metal silicide layer can be etched to silicon or metal silicide at relatively high $SiO_2$ to Si or metal silicide etch ratios, while controlling excess polymer build-up, and limiting production downtime.

The halogen-containing material typically comprises a fluorine-containing material, preferably $SF_6$, $NF_3$, HF or $F_2$, or combinations thereof. As for the hydrogen-containing material, it can comprise $H_2$, HF or $NH_3$, or combinations thereof. The chemical etchant system further preferably includes an inert gaseous material to assist in facilitating the subject selective etching process. Preferably, the inert gaseous materials comprise He, Ar, $N_2$, Ne, Kr or Xe.

BRIEF DESCRIPTION OF THE DRAWINGS

FIG. 1 is a pictorial representation of a prior art etching process employing a process in which a feed gas mixture containing carbon, hydrogen and halogen is introduced into a semiconductor etching work area so that polymer deposition occurs throughout the entire work area.

FIG. 2 is a pictorial representation of the subject etching process in which a halogen-containing material and a hydrogen-containing material are introduced into a similar semiconductor etching work area and combined with the carbon-containing chemical etchant protective patterned layer so that a polyhalocarbon is formed in situ only at localized sites and not throughout the entire work area.

DETAILED DESCRIPTION OF A PREFERRED EMBODIMENT

The inventive process herein is directed to selectively etching a multi-layer structure, such as a semiconductor device, in the manner prescribed herein. Referring now to FIGS. 1 and 2, schematic representations of multi-layer structures, generally designated as "10", are depicted. Each of the subject structures 10 comprise a plurality of layers including a layer of silicon dioxide 14 deposited onto an underlying silicon or metal silicide layer 16, which in turn is on an underlying substrate of various well known materials. Multi-layer structure 10 therefore comprises a plurality of layers including an outer silicon dioxide layer 14, having sidewalls 14a and a major outer surface 14b. The outer layer 14 is deposited onto an adjacent intermediate layer 16, having sidewalls 16a, which is fabricated of silicon or metal silicide.

Also shown in FIGS. 1 and 2 is a chemical etchant protective patterned layer or etch mask 12. Layer 12 comprises a photoresist layer having a predetermined arrangement of openings 12a for forming a predetermined pattern in multi-layer structure 10. Typically, this is accomplished using a chemical etch mask or other known conventional patterning techniques. In FIG. 1, the etch mask 12 is a conventional type fabricated of a carbon-less material, or a carbon-containing material. In FIG. 2, on the other hand, etch mask 12 must be fabricated of a carbon-containing material.

A preferred manner of etching of the respective layers 14 and 16 is by plasma etch deposition. The gas plasma etch technique employed herein typically take place in an etching area in a gas plasma generated under vacuum within the confines of an RF discharge unit. The preferred plasma etch technique employed herein may include the use of ECR, electro cyclotron resonance, RIE, MIE, PE reactive ion, point plasma etching, magnetically confined PE, or magnetron PE.

In FIG. 1, the multi-layer structure 10 located within a plasma etch deposition area 20 is etched in a conventional manner with a carbon-containing etchant material to form a predetermined pattern therein. This causes deposition of polyhalocarbon material in an uncontrolled fashion throughout the deposition area 20. In FIG. 2, a substantially carbon-free etchant material is employed. The carbon-free etchant material comprises a chemical etchant composition, typically in a substantially gas phase, including a halogen-containing material and a hydrogen-containing material with or without an inert gaseous material. The preferred halogen-containing materials and hydrogen-containing materials are as previously described. The chemical etchant composition including a halogen-containing material combine with the carbon-containing, chemical etchant protective patterned layer 12' at localized points, such as for example point "A", to form a polyhalocarbon material 22 in situ in a controlled manner. The polyhalocarbon material 22 reacts with oxygen which is released from the silicon dioxide layer 14 to form gaseous by-products which are readily removed from the multi-layer substrate 10. This exposes the outer surface of the silicon dioxide layer 14 for continued selective etching of the silicon dioxide layer by the chemical etchant system down to the silicon or metal silicide layer 16, until the silicon or metal silicide layer is exposed. When the requisite portion of the $SiO_2$ layer 14 is etched, there is no longer an oxygen source of oxygen to react with the polyhalocarbon material 22 as it is being formed. Therefore, the polyhalocarbon material remains in the selective formation area 20. Depositing the polyhalocarbon material on the oxygen-free silicon or metal silicide layer retards, and eventually terminates, the etching process with respect to the silicon or metal silicide layer.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A process for plasma etching a multi-layer substrate in an etching device having a plasma etch deposition area to form a etched pattern therein, comprising:

providing said multi-layer substrate having a plurality of layers comprising a silicon dioxide layer formed on an underlying silicon or metal silicide layer;

forming on a major surface of the silicon dioxide layer a carbon-containing, etch mask defining a plurality of openings in a predetermined pattern, said plurality of openings exposing a plurality of areas of a major surface of the silicon dioxide layer;

selectively plasma etching the plurality of exposed areas of the major surface of the silicon dioxide layer, selective to said silicon or metal silicide layer, with a carbon-free chemical etchant feed gas system comprising a halogen-containing chemical etching material and a hydrogen-containing material, at a relatively higher etch rate of the silicon dioxide than the underlying layer, selective to said underlying silicon or metal silicide layer, the hydrogen-containing material reacting with the halogen-containing material and the carbon-containing, chemical etchant protective patterned layer to form in situ a polyhalocarbon material reacting with oxygen which is released from the silicon dioxide layer to form gaseous by-products which are readily removed from the multi-layer substrate thereby exposing the surface of the silicon dioxide layer for continued etching of the silicon dioxide layer by said chemical etchant system; and exposing the silicon or metal silicide layer and, due to an absence of an oxygen source in the underlying silicon or metal silicon layer to react with said polyhalocarbon material being formed, retarding the etching process in said silicon or metal silicide layer by depositing said polyhalocarbon material on said silicon or metal silicide layer, thereby etching selectively said silicon dioxide layer so that the selectivity of the $SiO_2$ etch to the Si or metal silicide layer is maximized.

2. The process of claim 1, wherein the halogen-containing material comprises a fluorine-containing material.

3. The process of claim 2, wherein the fluorine-containing material comprises $SF_6$, $NF_3$, HF or $F_2$, or combinations thereof.

4. The process of claim 1, wherein the hydrogen-containing material comprises $H_2$, HF or $NH_3$, or combinations thereof.

5. The process of claim 1, wherein the chemical etchant system further includes an inert gaseous material comprising He, Ar, $N_2$, Ne, Kr or Xe.

6. The process of claim 2, wherein the fluorine-containing material comprises $SF_6$, $NF_3$, HF or $F_2$, or combinations thereof, and the hydrogen-containing material comprises $H_2$, HF or $NH_3$, or combinations thereof.

7. The process of claim 6, wherein the chemical etchant system further includes an inert gaseous material comprising He, Ar, $N_2$, Ne, Kr or Xe.

8. The process of claim 1, wherein the chemical etchant system comprises $SF_6$ and $H_2$, $SF_6$ and $NH_3$, $NF_3$ and $H_2$, $NF_3$ and $NH_3$, $SF_6$ and HF, or $NF_3$ and HF.

9. A chemical etchant system for plasma etching a multi-layer substrate having a plurality of layers including a silicon dioxide layer formed on an underlying silicon or metal silicide substrate having formed therein an etched pattern, comprising;

the multi-layer substrate having a carbon-containing, chemical etchant protective carbon-containing, chemical etch mask defining a plurality of openings in a pattern, said plurality of openings exposing a plurality of areas of a major surface of the multi-layer substrate; and a carbon-free chemical plasma etchant feed gas system including a halogen-containing chemical etching material and a hydrogen-containing material for selectively etching the plurality of exposed areas of the major surface of the silicon dioxide layer at a relatively higher etch rate than the underlying layer, selective to the underlying silicon or metal silicide, thereby forming an etched pattern in the silicon dioxide layer, thus, the etching terminates in the underlying silicon or metal silicide layer.

10. The process of claim 9, wherein the hydrogen-containing material comprises $H_2$, HF or $NH_3$, or combinations thereof.

11. The process of claim 9, wherein the chemical etchant system further includes an inert gaseous material comprising He, Ar, $N_2$, Ne, Kr or Xe.

12. The process of claim 9, wherein the halogen-containing material additionally comprises a fluorine-containing material.

13. The process of claim 12, wherein the fluorine-containing material comprises $SF_6$, $NF_3$, HF or $F_2$, or combinations thereof, and the hydrogen-containing material comprises $H_2$, HF or $NH_3$, or combinations thereof.

* * * * *